May 5, 1970 R. D. FISHER 3,510,567
TREMOLO AMPLIFIER CIRCUIT UTILIZING A FIELD EFFECT TRANSISTOR
Filed Nov. 28, 1966
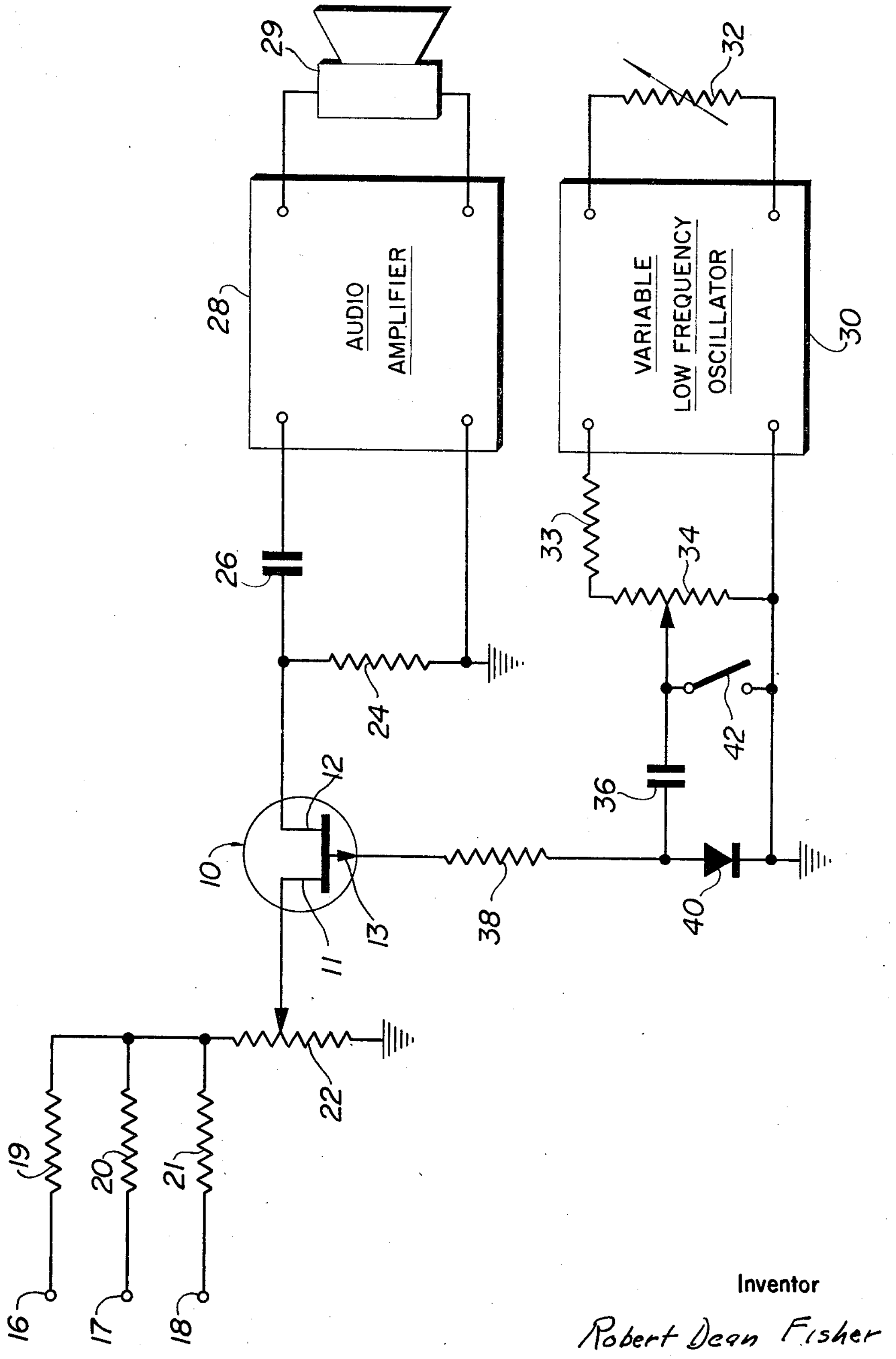
Inventor
Robert Dean Fisher
by
Mason, Kolehmainen, Rathburn and Wyss
Attorneys United States Patent Office 3,510,567

Patented May 5, 1970

3,510,567

TREMOLO AMPLIFIER CIRCUIT UTILIZING A FIELD EFFECT TRANSISTOR

Robert Dean Fisher, Bloomington, Ind., assignor to Sarkes Tarzian, Inc., Bloomington, Ind., a corporation of Indiana Filed Nov. 28, 1966, Ser. No. 597,281
Int. Cl. G10h *1/04*
U.S. Cl. 84—1.25 4 Claims

ABSTRACT OF THE DISCLOSURE

A field effect transistor is employed as a variable resistance in an audio amplifier circuit, the resistance of this transistor being varied by applying a low frequency tremolo signal to the gate electrode of said transistor. Signal blocking due to charging of the coupling capacitor employed to couple the tremolo voltage to the gate electrode is avoided by providing a diode which conducts when the signal applied to the gate electrode exceeds a predetermined value.

The present invention relates to amplifier circuits and, more particularly, to circuits for producing a tremolo effect in an amplifier employed in conjunction with a musical instrument such as a guitar.

Various arrangements have been employed heretofore for producing a tremolo effect in conjunction with the amplification of an audio signal from a musical instrument such as a guitar. This tremolo effect has been an amplitude modulation of the audio signal by a tremolo frequency of relatively low frequency in the range of 10 to 2 cycles per second. This tremolo effect in which the audio signal is amplitude modulated is to be distinguished from the vibrato effect in which the frequency or phase of the audio signal is modulated either separately or in conjunction with an amplitude modulation.

While these prior art arrangements have been satisfactory for their intended purpose, in many instances, the operation of the tremolo circuit produces undesirable side effects. For example, in many of the arrangements proposed heretofore, the modulating tremolo frequency is passed through the amplifier circuit in the absence of an input audio signal. Sufficient feedthrough from the tremolo frequency is still produced to move the speaker cone in and out with the result that an undesirable low frequency "blooping" in the speaker is produced. Furthermore, in many such arrangements the tremolo effect is produced only in connection with an attendant vibrato effect whereas in many instances a pure tremolo modulation would be more desirable.

It is, therefore, an object of the present invention to provide a new and improved tremolo amplifier circuit wherein one or more of the disadvantages of the prior art arrangements are avoided.

It is another object of the present invention to provide a tremolo amplifier circuit wherein the tremolo frequency is not produced in the loud speaker in the absence of an audio signal from the associated musical instrument.

It is a further object of the present invention to provide a new and improved tremolo amplifier circuit wherein modulation of the input audio signal is accomplished at low level by means of a high input impedance device which effectively blocks the tremolo frequency in the absence of audio input.

It is a still further object of the present invention to provide a new and improved tremolo amplifier circuit wherein a field effect transistor is employed as a variable resistance to produce a tremolo effect at low audio levels while effectively preventing tremolo frequency feedthrough.

It is another object of the present invention to provide a new and improved tremolo amplifier circuit which is economical and simple to manufacture and produces a tremolo effect in an efficient manner.

The invention, both as to its organization and method of operation, together with further objects and advantages thereof, will best be understood by reference to the following specification taken in connection with the accompanying drawings in which:

The single figure of the drawing is a schematic drawing showing the tremolo amplifier circuit of the present invention.

Referring now to the drawing, the tremolo amplifier circuit of the present invention is therein illustrated as comprising a field effect transistor indicated generally at 10, this transistor being provided with a source electrode 11, a drain electrode 12 and a gate electrode 13. An audio input signal from any one of a number of sources, such as different guitar pickups, for example, may be applied to the input terminals 16, 17 and 18. These audio input signals are applied through isolating resistors 19, 20 and 21 to a common input potentiometer 22, the arm of which is connected to the source electrode 11 of the field effect transistor 10. The drain electrode 12 of the transistor 10 is connected through a resistor 24 to ground and the audio signal developed across this resistor is coupled through a capacitor 26 to a suitable audio amplifier indicated generally at 28. In this connection, it will be understood that the amplifier 28 may comprise a one or more stage preamplifier and suitable facilities for producing a delayed audio signal and commonly known as a reverb unit, as will be readily understood by those skilled in the art.

In order to produce a tremolo effect in conjunction with the audio signal produced across the potentiometer 22, there is provided a variable frequency oscillator indicated generally at 30 which is provided with a suitable adjustment device such as the illustrated adjustment device 32 for varying the frequency of the oscillator 30 over a range of from 2 to 10 cycles per second. The output from the oscillator 30 is coupled through a resistor 33 to a potentiometer 34 and the tremolo frequency developed at the arm of the potentiometer 34 is coupled through a capacitor 36 and a resistor 38 to the gate electrode 13 of the field effect transistor 10.

Considering now the operation of the tremolo amplifier circuit described thus far, the field effect transistor 10 is of the general type comprising a semiconductor channel, a path whose conductance or resistivity is controlled by applying an electric field perpendicular to the current. Specifically, this transistor is of the type wherein the resistance between the source and drain electrodes 11 and 12 of the transistor varies in accordance with the voltage applied to the gate electrode 13. This effect is true for voltages of small amplitude on either side of zero. For example, the transistor 10 may be of the material type 2N4360 and will exhibit the desired change in response over a range of approximately plus 0.5 volt to minus 0.5 volt.

It will be seen that the source-drain circuit of the transistor 10 is in series with the resistor 24 and hence these two circuit elements comprise a voltage divider. The tremolo frequency developed by the oscillator 30 is developed across the potentiometer 34 and is applied to the gate electrode 13 through the indicated capacitor 36 and audio resistor 38. Accordingly, the resistance of the source-drain circuit of the transistor 10 varies in accordance with the modulating tremolo frequency.

However, the tremolo frequency does not intermingle with or feed through to the source-drain circuit of the transistor 10 due to the high input impedance of this transistor and the series resistor 38. Preferably, the resistor 38 has a value of about 10 megohms so that the potential on the gate electrode 13 may be varied to produce a corresponding variation in the resistance of the source-drain circuit at the tremolo frequency. Since the source-drain resistance of the transistor 10 is thus varied at the tremolo frequency, it will be evident that the amplitude of the audio signal produced across the resistor 24 will vary in a corresponding manner. In this connection it will be understood that the transistor 10 does not produce any amplification of the input audio signal developed across the potentiometer 22. In fact, the amplitude of the audio signal produced across the resistor 24 is less than the audio input signal at the arm of the potentiometer 22 due to the drop in voltage across the source-drain resistance of the transistor 10.

In order to prevent the build up of voltage on the gate electrode 13 and the consequent blocking of the transistor 10 which would cause an undesired interruption of the audio signal, a diode 40 is connected from the junction of the capacitor 36 and resistor 38 to ground. This diode may comprise any suitable rectifier element which does not conduct until the amplitude of the signal frequency reaches the maximum desired value for application to the source-gate electrodes 11, 13. For example, the diode 40 may comprise a suitable silicon diode which does not conduct until the signal frequency amplitude reaches a value of about 0.6 volt. When the signal frequency has an amplitude less than 0.6 volt, the diode 40 remains non-conductive and the resistance of the source-drain circuit of the transistor 10 varies in accordance with the tremolo frequency. However, if the amplitude of the signal frequency becomes larger than 0.6 volt, the diode 40 will conduct and prevent the build up of voltage on the gate electrode 13 which would tend to block conduction of the source-drain of transistor 10.

Under certain circumstances, it may be desirable to remove the tremolo effect from the audio input signal. This can be readily done by means of a switch 42 which shunts the output of the potentiometer 34 to ground and hence removes the tremolo frequency voltage from the gate electrode 13. The source-drain circuit of the transistor 10 then has a fixed conductivity so that the audio input signal is applied to the input of the amplifier 28 without tremolo modulation. The switch 42 may be conventionally comprised of a foot operated switch so that the amplifier of the musical instrument such as a guitar may remove the tremolo operation as desired.

It will be noted that since the tremolo frequency effects only the resistivity of the source-drain circuit of the transistor 10, the audio input signal is modulated only in amplitude at the tremolo frequency rate, and no phase or frequency shift of the audio input signal is produced. Furthermore, in the absence of an audio input signal applied to the potentiometer 22, the high input impedance of the gate circuit 13 effectively prevents the transmission of the tremolo frequency itself through the amplifier

28 of the loud speaker 29. Accordingly, no undesirable actuation of the speaker cone at the tremolo frequency is produced with the circuit arrangement of the present invention.

While there has been illustrated and described a single embodiment of the present invention, it will be apparent that many variations may be made therein, all within the true spirit and scope of the invention.

What is claimed as new and desired to be secured by Letters Patent of the United States is:

1. A tremolo circuit for producing an amplitude variation of a given audio signal, comprising a field effect transistor having source, drain and gate elements, a source of audio signals, a resistor, means connecting the source-drain circuit of said field effect transistor and said resistor in series across said source of audio signals, whereby said audio signals are developed across said resistor, a source of oscillations suitable for producing a desired tremolo effect, means including a capacitor for connecting said source of oscillations to said gate element, thereby to modulate the audio signal developed across said resistor in accordance with said oscillations by variation of the source-drain resistance of said field effect transistor, and means including a diode connected to said capacitor for preventing charge buildup on said capacitor and consequent blocking of said field effect transistor.

2. The tremolo circuit as set forth in claim 1, wherein there is provided switch means for preventing said tremolo oscillations from being applied to said gate element.

3. The tremolo circuit as set forth in claim 2, wherein said switch means is a foot operated switch.

4. A tremolo circuit for producing an amplitude variation of a given audio signal, comprising a field effect transistor having source, drain and gate elements, a source of audio signals, a resistor, means connecting the source-drain circuit of said field effect transistor and said resistor in series across said source of audio signals, whereby said audio signals are developed across said resistor, a source of oscillations suitable for producing a desired tremolo effect, means including a capacitor and a series impedance of large value for connecting said source of oscillations to said gate element, and means including a diode connected to the junction of said capacitor and said series impedance for preventing charge buildup across said capacitor and consequent blocking of said field effect transistor.

References Cited

UNITED STATES PATENTS

| | | | |
|---|---|---|---|
| 3,075,044 | 1/1963 | Kuchera ---------- | 331—106 X |
| 3,327,133 | 6/1967 | Sickles ------------ | 307—304 X |
| 3,397,353 | 8/1968 | Hitt et al. | |

HERMAN KARL SAALBACH, Primary Examiner

P. L. GENSLER, Assistant Examiner

U.S. Cl. X.R.

307—304; 332—31